(12) United States Patent
Kirschenmann

(10) Patent No.: US 7,521,974 B2
(45) Date of Patent: Apr. 21, 2009

(54) TRANSLATIONAL PHASE LOCKED LOOP USING A QUANTIZED INTERPOLATED EDGE TIMED SYNTHESIZER

(75) Inventor: Mark A. Kirschenmann, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 54 days.

(21) Appl. No.: 11/443,971

(22) Filed: May 31, 2006

(65) Prior Publication Data

US 2007/0279109 A1  Dec. 6, 2007

(51) Int. Cl.
*H03L 7/06* (2006.01)
(52) U.S. Cl. .................................. 327/156; 327/147
(58) Field of Classification Search .................. None
See application file for complete search history.

(56) References Cited

U.S. PATENT DOCUMENTS

| | | | |
|---|---|---|---|
| 5,028,887 A * | 7/1991 | Gilmore | 331/18 |
| 5,230,013 A | 7/1993 | Hanke et al. | |
| 5,329,253 A * | 7/1994 | Ichihara | 331/17 |
| 6,115,586 A * | 9/2000 | Bezzam et al. | 455/112 |
| 6,255,912 B1 | 7/2001 | Laub et al. | |
| 6,366,174 B1 * | 4/2002 | Berry et al. | 331/78 |
| 6,420,916 B1 * | 7/2002 | Freeman | 327/156 |
| 6,510,191 B2 | 1/2003 | Bockelman | |
| 6,650,721 B1 * | 11/2003 | Janesch et al. | 375/376 |
| 6,914,464 B2 * | 7/2005 | Maeda | 327/156 |
| 6,993,314 B2 * | 1/2006 | Lim et al. | 455/333 |
| 2003/0058004 A1 | 3/2003 | Stengel et al. | |
| 2003/0099321 A1 | 5/2003 | Juan et al. | |
| 2003/0112043 A1 * | 6/2003 | Takahashi | 327/156 |
| 2003/0119465 A1 | 6/2003 | Martin et al. | |
| 2003/0119466 A1 | 6/2003 | Goldman | |
| 2003/0152181 A1 | 8/2003 | Stengel et al. | |
| 2005/0104667 A1 * | 5/2005 | Williams | 331/12 |

\* cited by examiner

*Primary Examiner*—Cassandra Cox
(74) *Attorney, Agent, or Firm*—Dillon & Yudell LLP

(57) ABSTRACT

A direct digital synthesizer (DDS) such as a Quantized Interpolated Edge Timed (QuIET) synthesizer is implemented in the feedback path of a translational Phase Lock Loop (PLL). The frequency translation introduced by the synthesizer reduces the amplification of reference feedback path noise sources, thereby enabling a wider loop bandwidth and improving high-pass filtering of phase noise without the addition of a second PLL.

15 Claims, 3 Drawing Sheets

TRANSLATIONAL PHASE LOCKED LOOP USING A QUANTIZED INTERPOLATED EDGE TIMED SYNTHESIZER

BACKGROUND OF THE INVENTION

1. Field of the Invention

The present invention is related to a phase locked loop and, more particularly, a phase locked loop utilizing a digital frequency synthesizer.

2. Description of the Related Art

One of the circuits that has been particularly useful in communications electronics is the Phase Lock Loop (PLL). A PLL circuit is a circuit that is used for the synchronization of signals. Phase lock loops may be used in a wide variety of electronic circuits, in which signals, containing analog and digital information, are decoded. Phase lock loops may be thought of as synchronizing circuits, in which an output frequency is synchronized, or locked, to a reference frequency. PLLs are also used in mobile communication applications related to such purposes as frequency generation, signal modulation, signal demodulation, data decoding and data encoding. Phase lock loops have application not only in frequency synchronization, but also in frequency synthesis, and frequency generation. PLL's may incorporate divider, multiplier, or mixer circuits in order to create lower, higher, or translated frequencies.

As a consequence, the phase locked loop (PLL) forms the basis of most modern carrier generation synthesizer solutions. The synthesizer technique aims to get a high quality (low phase noise), high frequency oscillator to be locked to a stable, low level, low cost (often crystal derived) source. The frequency synthesizer is commonly used in radio frequency devices to provide generation of local oscillator (LO) high frequency signals. Applications include, for example, the read channel in a hard disk drive, and for RF wireless communications such as cellular and digital cordless telephone local oscillator applications. Several of these applications require low phase noise and small frequency steps of the frequency synthesizer.

For an RF wireless application, a transmitter and receiver require a synthesizer to up convert and down convert modulated and received signals. In some RF wireless examples, a clock frequency of 1100-1200 MHz in small 200 KHz steps is required of the synthesizer to meet the channel spacing requirements. Here again, low phase noise may be required to have a high sensitivity in the receiver and not allow noise power to spill over into adjacent channels. In addition, the need is especially great in the RF wireless and other hand held portable device applications to integrate the entire synthesizer and Voltage Controlled Oscillator (VCO) on a single semiconductor chip, for size, power, manufacturing, and economic reasons.

Thus, two important factors affecting the design of a carrier frequency source are frequency stability and phase noise. Frequency stability generally refers to the stability of the oscillator with respect to temperature and aging, and determines the channel spacing required to contain the modulated carrier signal. Conversely, for a given regulated channel spacing, the frequency stability determines the maximum data rate that can be supported without violating the channel boundary. Phase noise generally refers to the oscillator phase jitter resulting in a broadband component to the carrier signal which will extend into adjacent channels. If the phase noise is too high, this can corrupt the modulation source itself, and limit adjacent channel selectivity due to reciprocal mixing.

Previous frequency synthesizers use single loops or complex multi-loop solutions to generate the desired output frequency and step size for a local oscillator. In the production of this high frequency, conventional synthesizers use a high multiplication of the original input reference signal. But as a byproduct, they also detrimentally multiply the frequency step size, the phase noise, and generate spurious signals. This multiplication in the conventional synthesizer (both for its advantages and disadvantages) is done by the dividers in the PLL loops, and by the mixer in the final loop.

A more recent extension of the basic PLL based synthesizer is the fractional-N device. A simple form of PLL synthesizer contains a voltage controlled oscillator (VCO) operating at the required carrier frequency, a frequency divider, which is a digital divider circuit, a phase detector circuit and a loop filter. FIG. 1 illustrates this type of simple conventional synthesizer. The synthesizer circuit 9 acts to lock its output to the reference frequency ($D_{IN}$), resulting in an output frequency (carrier) of VCO_OUT. The input reference frequency $D_{IN}$ is compared in a phase/frequency detector 2 to that of the divided down feedback from the output of a divider 5 (VCO_OUT/N), as a result of the frequency produced by a VCO 6. The output of the phase/frequency detector 2 is filtered by a loop filter 8, which produces a voltage to control the frequency output (VCO OUT) of VCO 6.

A fractional divide-by-N PLL (fractional-N) is used to get small frequency steps, and a narrow bandwidth is used to filter out the spurious signals generated by the method. However, the fractional divide-by-N also puts spurious signals inside the loop bandwidth and sigma delta techniques are used in an attempt to eliminate the effects of the fractional spurs. Further, the phase noise requirement for wireless applications, for example, is so low that an external VCO is required in a fractional-N synthesizer. As can be seen, a fractional divide-by-N synthesizer can produce small frequency steps, but usually requires an external VCO for phase noise and a narrow bandwidth filter for spurious signals generated inside the loop bandwidth to eliminate the effects of the fractional spurs. Consequently, the fractional-N technique has limited improvement usefulness.

One conventional multi-loop solution uses a fractional-N PLL coupled as the input reference signal to a translational PLL to provide filtering through the translation loop. The divider and translation loop arrangement produces relatively high frequency output components which are filtered and produce low noise side bands due to the low multiplication factors used. The mixer in the final translation PLL produces a low phase noise output signal that has been filtered by the translation loop filters and which may be fully integrated on a semiconductor chip. While the translational PLL technique improves the loop bandwidth, a second PLL is necessary to generate the mixer local oscillator (LO) signal. This additional PLL increases the circuit complexity, power consumption and cost.

Recently, direct digital synthesizers (DDS) based on time domain interpolation have emerged as an attractive option for frequency generation, particularly for wide bandwidth applications. For portable communication applications, implementations that have a low power consumption specification are particularly valuable. In one known approach, a reference clock signal is used to derive another frequency signal based on a relationship between both signals. An accumulator operating in response to the reference clock signal accumulates a digital value related to the relationship between the desired frequency signal and the reference clock signal until a maximum value is reached and an accumulator overflow occurs. The accumulator overflow is used to trigger the output of the desired frequency signal and the operation of any correction circuitry for perfecting the signal.

Quantized Interpolated Edge Timed (QuIET) synthesis is one such DDS technique that uses a reference PLL synthesizer to generate the input clock. In wireless applications, the transceiver LO frequencies are generated at the output of the QuIET synthesizer. In applications where intra-stage filtering between the RF modulator and the power amplifier are not used, the QuIET DDS must meet the phase noise and spurious requirements in the receive frequency bands and in the transmit adjacent bands. This additional PLL increases the circuit complexity, power consumption and cost. Some of the problems with the QuIET synthesizer implementation are the DLL delay quantization and mismatch can cause spurs, which are tethered into the phase noise. Also the noise in-band is often too high, so sigma-delta modulators noise shaping is applied, further increasing implementation area and cost. Again, while the QuIET synthesis technique improves loop bandwidth, an additional PLL is necessary to generate the mixer local oscillator (LO) signal.

Accordingly, there is a need for a synthesizer circuit that does not suffer from the problems seen in the prior art with translational PLLs and direct digital sythesizers. There is a need for a synthesizer circuit with a large bandwidth for generating a high frequency in small frequency steps with low phase noise, in a small, low cost, low power solution, which is fully integrated on a semiconductor chip. It would be desirable for such a solution to not require an additional reference PLL to generate the input signal.

BRIEF DESCRIPTION OF THE DRAWINGS

This invention is described in a preferred embodiment in the following description with reference to the drawings, in which like numbers represent the same or similar elements and one or a plurality of such elements, as follows.

DETAILED DESCRIPTION OF PREFERRED EMBODIMENTS

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims. In particular, although the preferred embodiment is described below with respect to a wireless mobile communication device, it will be appreciated that the present invention is not so limited and that it has application to other embodiments of electronic devices such as portable digital assistants, digital cameras, portable storage devices, audio players and portable gaming devices, for example.

Generally, in accordance with the preferred embodiment of the present invention, a QuIET synthesizer is implemented in the feedback path of a translational Phase Lock Loop (PLL). In a preferred embodiment of a wireless transceiver, a Complimentary Metal Oxide Semiconductor (CMOS) switching mixer is used to translate the beacon signal to the crystal reference frequency. The mixer inputs are the QuIET synthesizer reference clock input and the QuIET synthesizer output signal. As an additional feature of the preferred embodiment, the transceiver frequency is programmable using the QuIET synthesizer. Frequency modulation (FM) digital words can also be applied to the QuIET synthesizer for addition of frequency modulation to the transmitted signal. The frequency translation introduced by the preferred embodiment reduces the amplification of reference feedback path noise sources typically encountered in PLLs using feedback frequency dividers. This may enable wider loop bandwidth to be used, thereby allowing the high-pass filtering of the VCO phase noise to be improved. As will be further appreciated, the phase noise and spurious signals output from the QuIET may be attenuated by the PLL loop filter because the QuIET synthesizer is placed in the translational PLL feedback path. Using a QuIET synthesizer in the feedback path replaces fractional and feedback divider control circuit implementations of translation PLLs, and may enable the use of the translational PLL technique without the addition of a second PLL to generate the mixer LO signals. Further, the overall loop filter integrated area may be reduced while allowing a wider loop bandwidth. As will be further appreciated, the implementation of the preferred embodiment may further allow for the integration of the VCO with the PLL on a single integrated circuit for standards with narrow channel spacing.

Figure 1:
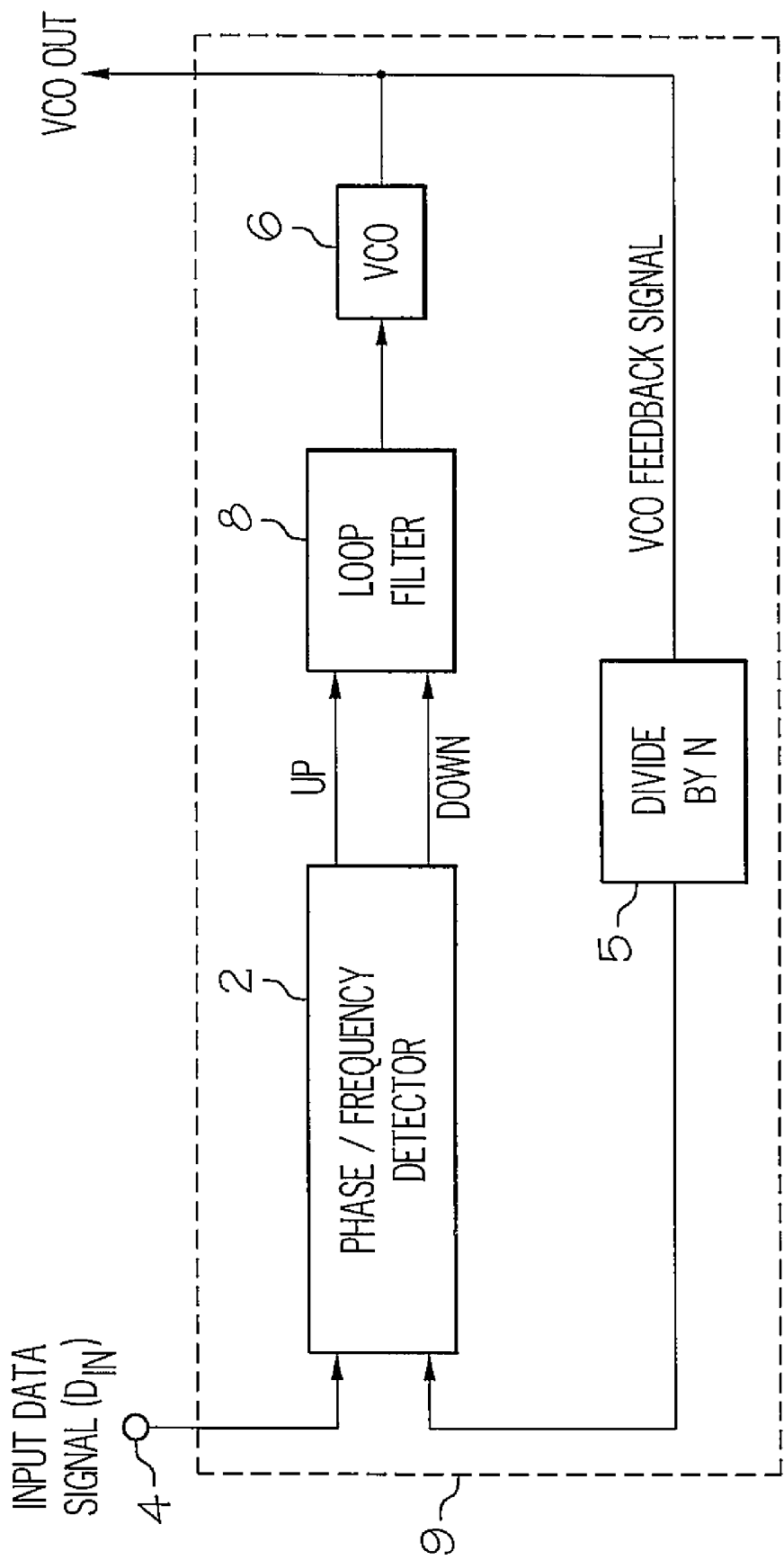
FIG. 1 illustrates a simple conventional fractional-N synthesizer.
Figure 2:
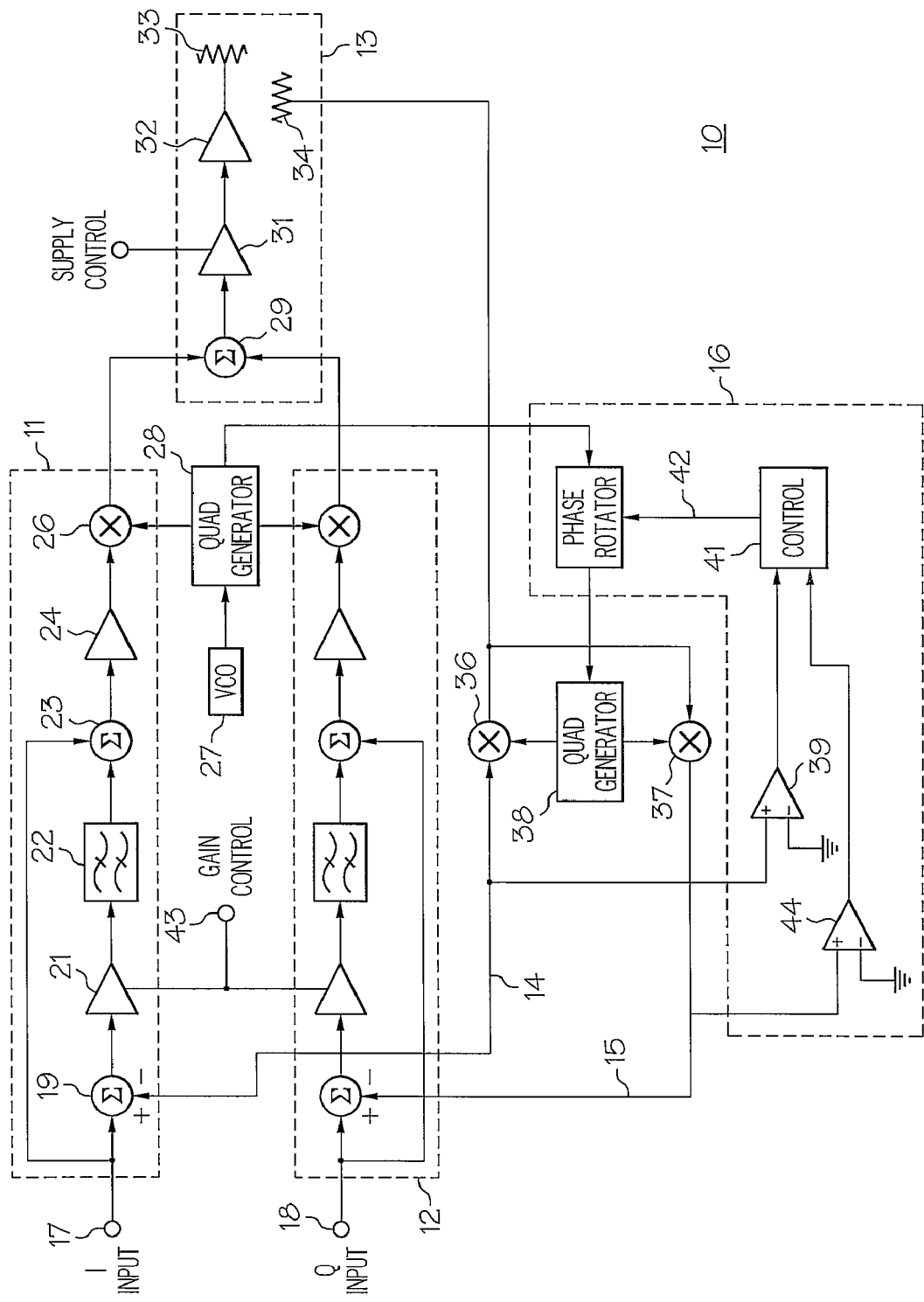
FIG. 2 is a block diagram of a Cartesian feedback transmitter suitable for utilization of a translational PLL in accordance with a preferred embodiment.

FIG. 2 is a block diagram of a Cartesian feedback transmitter suitable for utilization of a translational PLL in accordance with a preferred embodiment. The Cartesian feedback transmitter can be seen as generally depicted by the reference numeral 10. The transmitter 10 includes generally a first and second information signal path 11 and 12, a combined information signal path 13, first and second feedback paths 14 and 15, and a phase adjustment unit 16. The first and second information signal paths 11 and 12 are identical to one another in this embodiment. They differ only in that the first path 11 receives an in-phase base-band information input signal 17, whereas the second path 12 receives a quadrature base-band information input signal. Therefore, only the first path 11 will be described in detail.

The first information path 11 couples its input 17 to a differential summer 19. The remaining input to this differential summer 19 couples to the first feedback path 14. The summer output couples to a variable gain base-band amplifier 21 that itself couples through a low-pass filter 22 to a summer 23. Variable gain base-band amplifier 21 provides gain control of the information path 11 by gain control signal 43. The remaining input to this summer 23 couples to the input 17 to support open loop operation. The output of the summer 23 passes through another amplification stage 24 to a mixer 26, which up-converts the incoming base-band signal to a predetermined carrier frequency of choice. The injection signal for the mixer 26 is provided by a quadrature generator 28 modulated by PLL 27, with the second information path 12 receiving an injection signal that has been phase shifted by 90 degrees by quadrature generator 28. VCO 27 incorporates a translational loop with a QuIET synthesizer in its feedback path, in accordance with a preferred embodiment of the present invention.

The outputs of both information paths 11 and 12 couple to the inputs of a summer 29 that represents the input to the combined information signal path 13. The output of the summer 29 couples to the input of an exciter 31 and then through a power amplifier (PA) 32 to an appropriate output element 33. A coupler 34 responsive to the output of the PA 32 provides a feedback signal to both the first and second feedback paths 14 and 15. The up-converted signal as obtained from the PA output is first down-converted through appropriate RF feedback downconverters 36 and 37, and then provided to the subtractive inputs of the first and second information signal path differential summers 19 as mentioned above. The down-conversion injection signals for the RF feedback downconverters 36 and 37 are provided in quadrature by quadrature generator 38 under the provision of an appropriate phase shift by a phase shift unit 16.

The phase shift unit 16 provides comparators 39 and 44 to detect phase differences between the two inputs 17 and 18 and the two feedback paths 14 and 15, and to provide any differential information to a control unit 41 that in turn controls a phase rotator 42 that couples between the quadrature generator 28 and the quadrature generator 38 to provide a phase shift to the quadrature signals received from quadrature generator 28 and then applied to the inputs of quadrature generator 38, which generates the injection inputs for the radio frequency (RF) feedback downconverters 36 and 37.

Figure 3:
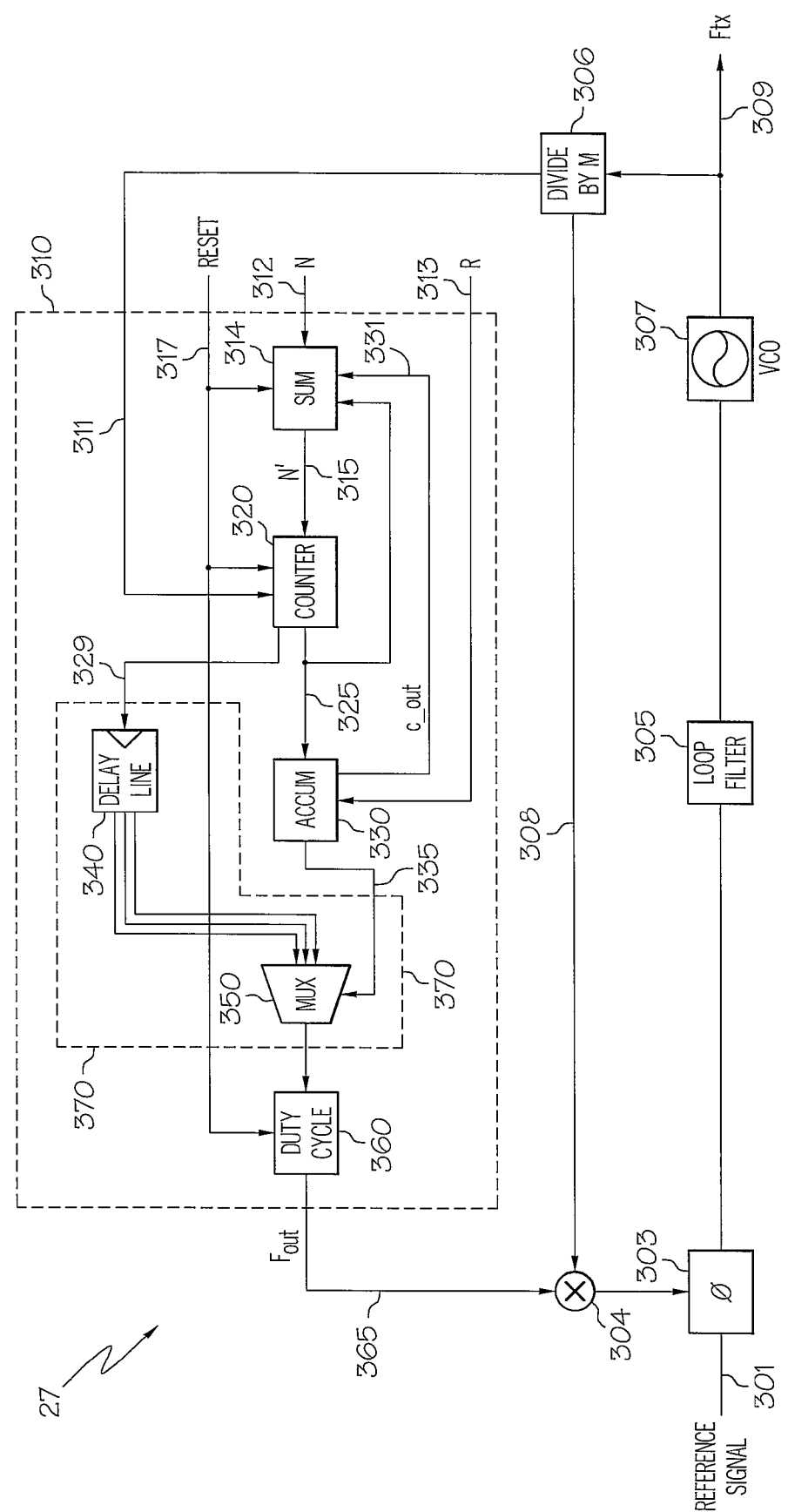
FIG. 3 is a detailed block diagram of a translational phase locked loop (PLL) utilizing direct digital frequency synthesis in the feedback path, in accordance with a preferred embodiment of the present invention.

FIG. 3 is a more detailed block diagram of one embodiment of a translational phase locked loop (PLL) 27 utilizing direct digital frequency synthesis in the feedback path, in accordance with a preferred embodiment of the present invention. In the embodiment shown, the DDS is a QuIET synthesizer but other types of DDSs may be used in alternative preferred embodiments. A translation loop is a phase lock loop that shifts or translates a frequency $f_1$ by an amount $f_{translation}$ so that resultant frequencies, of $(f_1+f_{translation})$ and $(f_1-f_{translation})$ are produced. The functioning of the translation loop of a preferred embodiment is illustrated in the following example of FIG. 3.

A reference signal 301 at a reference frequency (for example, 200 MHz) is coupled into a phase detector 303. The output of the phase detector 303 is then provided to the loop filter 305. The output of the loop filter 305 is coupled into a voltage controlled oscillator (VCO) 307, and controls the transmit frequency $F_{tx}$ 309 of the voltage controlled oscillator 307. Illustratively, the voltage controlled oscillator has a center frequency of 1 GHz. The output frequency of the VCO 307, which is 1 GHz in the present example, is coupled into a mixer 304 through a Divide-by-M fractional-N circuit 306 (a divide-by-1 in this exemplary embodiment but a divide-by-6 in an alternative embodiment). Also coupled into the mixer 304 is a QuIET synthesizer 310 generating an output synthesized from the output of the fractional-N circuit 306, illustratively 800 MHz in the present example. The result of mixing signals of 800 MHz and 1 GHz is that sum and difference frequencies (1 GHz−800 MHz=200 MHz, and 1 GHz+800 MHz=1.8 GHz) are produced. In the embodiment shown, the loop parameters are adjusted so that the loop cannot respond to the 1.8 GHz mirror frequency created by the mixer 304. In the embodiment shown, the feedback frequency 365 generated by the synthesizer 310 is effectively limited to the 200 MHz, without the aid of a filter having to reject the 1.8 GHz mirror frequency.

The synthesizer 310 receives the output 308 of the fractional-N circuit 306 as a reference clock signal 311. The synthesizer 310 generates a derived frequency signal ($F_{out}$) 365 from the reference clock signal ($F_{clk}$) 311 based on the relationship ratio ($F_{clk}/F_{out}$)=N+R, where the N is an integer portion and R is a fractional portion of the ratio. In start up operation of the translational PLL of a preferred embodiment, a course trim is applied to the VCO to set its output frequency to an approximate expected frequency. The feedback loop 308 is first held open by switch circuitry in the main loop, for example in fractional-N circuit 306 (not shown). With the main loop open, the synthesizer 310 is locked. Thereafter, the main loop 308 is closed through a switch (not shown) such as fractional-N circuit 306. This timing sequence allows the PLL to acquire a lock on the reference frequency.

According to one embodiment, a counter 320 is coupled to the reference clock signal and operates to count cycles of the reference clock signal 311 and to generate a counter overflow signal 325 after counting a minimum of N cycles, where N is the integer portion of the above-mentioned ratio. A phase accumulator 330 is coupled to the counter 320 and has an input of a step value 313 equal to the fractional portion R of the above-mentioned ratio. The accumulator 330 accumulates the step value R in response to the counter overflow signal, i.e., each time the counter overflow signal is generated. The accumulator 330 generates an accumulator overflow signal 331 when accumulation of the fractional portion R results in an overflow of the accumulator.

The accumulator is further operated to increase the accuracy or resolution of the signal generator. Upon startup or reset, the accumulator is preloaded with an initial value 313 corresponding to a rounding factor. The rounding factor is based on the predetermined resolution of the accumulator. Preferably, for an accumulator in which the "p" most significant bits are used for addressing information, the rounding factor is determined by setting the $(p+1)^{th}$ bit, the bit one less significant than the p most significant bits used for addressing. For example, in an 8-bit accumulator in which the first 4 bits are used for addressing purposes, the initial value is determined by setting the $5^{th}$ bit, i.e., the value in binary could be 00001000. The rounding effect is perpetuated throughout the frequency generation process without further action beyond the loading of the initial value. Accordingly, the accuracy of the accumulated fractional portion of the frequency of the reference signal represented by the contents of the accumulator is automatically increased without the use of complex hardware or signal processing.

In a preferred embodiment, the counter 320 uses rising edges of the reference clock signal for counting purposes. However, one skilled in the art would appreciate that other signal transitions could be used to trigger the counting mechanism. Based on this counting technique, the actual number of rising edges of the reference signal that is equivalent to a minimum of N cycles may be N or N+1. This determination may be based on the overflow status of the accumulator 330. Accordingly, a summer 314 is coupled to the counter 320 to provide the proper counter control input to the counter 320. The summer 314 has a first input 312 of N representing the required minimum number of cycles, and a second input (c_out) coupled to the overflow signal output 331 from the accumulator. Preferably, the accumulator overflow signal 331 has a value of 0 when there is no accumulator overflow and a value of 1 when an accumulator overflow condition exists. The summer 314 sums both the first and second inputs and generates an output (N') 315 that forms the count control input of the counter 320.

The output of the accumulator 330 is used to trigger the output of the desired frequency signal $F_{out}$, including the operation of any correction circuitry for perfecting the signal. In the preferred embodiment, the output of the accumulator is address information used to select one of a number of selectable delays for governing output of the desired frequency signal. The delay corresponds to the accumulated fractional portion of the reference signal, if any, that must be accounted for prior to outputting the desired output signal based on the established relationship between the frequency of the reference signal and the frequency of the desired output signal. Accordingly, the output 335 of the accumulator 330 is coupled to a delay block 370 that includes a tapped delay line 340 and a multiplexer 350. The tapped delay line 340 preferably includes a number of selectable delay lines, each operating to delay a signal by differing amounts of time. The delay block represents multiple delay paths, each being selectable by addressing the multiplexer 350. When a signal is sent through the delay block 370, the path taken by the signal through the delay block and hence the corresponding delay is governed by the addressing of the multiplexer. Thus, the delay block 370 is responsive to the address information outputted from the accumulator 330 to select one of the delay paths to govern output of the desired signal. The number of the delay lines or paths and the number of bits associated with the accumulator are both selected to effect a particular resolution for the synthesizer 310.

The delay block 370 is preferably clocked by an output 329 from the counter, and in effect operates at or near the clock rate of the desired output signal. In the preferred embodiment, when the counter value is zero, a pulse is sent through the delay block, which ultimately forms the basis of the desired output signal $F_{out}$. Ordinarily, the counter has a value of zero upon reset or immediately following an overflow of the counter. This corresponds with the output of address information 335 outputted from the accumulator 330 that operates on a control input to multiplexer 350 or other selection device to pass one of multiple inputs to multiplexer 350 from delay line 340 and select the appropriate delay path through the delay block for the pulse. In this manner, the delay block is selectively enabled coincidentally with the output of address information from the accumulator and otherwise disabled in conjunction with a primary operating mode. The delay block is coupled to a duty cycle block 360 that conditions the pulse and outputs the desired signal 365. A reset signal line 317 is coupled to the summer 314, the counter 320, the accumulator 330, and the duty cycle block 360 for reset purposes. As will be appreciated by those skilled in the art, various other buffer and filter components not shown may be used to implement the PLL 27. For example, a buffer on the output of the PLL would typically be included in the circuit.

As will be appreciated, the translational PLL of a preferred embodiment may result in lower in-band phase noise for optimal transverse adjacent channel co-power ratios (AC-CPR), maximum receiver adjacent channel blocker levels (blocker phase noise reciprocal mixing), and single-port frequency modulation (FM) for constant envelope and polar modulators. Using the QuIET synthesizer in the feedback loop of the PLL may avoid having a second synthesizer usually required when using translational loops. Further, by avoiding using a fractional-N implementation, the down-mixer noise powers do not add to the in-band noise. Still further, varied wide loop bandwidths are possible with the translational loop of the preferred embodiments. Historically, a translational PLL may use a secondary frequency-agile PLL synthesizer driving a down-conversion mixer in the feedback path of the primary PLL. By placing the QuIET synthesizer in the feedback path, translation can be achieved without the secondary PLL. Also, low in-band phase noise with the translational PLL may allow for a wider loop bandwidth to be used, which provides more filtering of VCO phase noise.

While the invention has been particularly shown and described with reference to preferred embodiments, it will be understood by those skilled in the art that various changes in form and detail may be made therein without departing from the spirit and scope of the invention. Any variations, modifications, additions, and improvements to the embodiments described are possible and may fall within the scope of the invention as detailed within the following claims.

What is claimed is:

1. A signal generator responsive to a reference clock signal having a reference frequency to generate a desired output signal having an output frequency, the signal generator comprising:
   a phase detector, that has a feedback input and a reference signal input, and that compares a reference signal and generates a difference signal;
   a loop filter coupled to the phase detector, that generates a control signal in response to the difference signal;
   an oscillator coupled to the loop filter that generates an oscillator signal in response to the control signal and produces the output signal at an output; and
   a feedback circuit coupled to the output and the feedback input that accepts the output signal and couples the output signal to the feedback input of the phase detector, wherein the feedback circuit includes:
   a digital signal synthesizer coupled to the oscillator signal at an input, and
   a mixer coupled to the digital signal synthesizer to receive the synthesizer output at a first input, and being coupled to the output signal at a second input and wherein the output of the mixer is coupled to the feedback input of the phase detector.

2. The signal generator of claim 1, the digital signal synthesizer comprising:
   a counter coupled to the reference clock signal and responsive thereto to generate a counter overflow signal based on counting a particular number of cycles of the reference clock signal, wherein the particular number of cycles is related to a relationship between the reference clock signal and the desired signal; and
   an accumulator coupled to the counter and having an input of a step value related to a relationship between the reference clock signal and the desired signal, the accumulator being responsive to the counter overflow signal to output address information based on an accumulation of the step value for governing output of the desired signal.

3. The signal generator of claim 2, wherein the digital signal synthesizer further comprises a delay block having a plurality of delays for governing output of the desired signal, wherein the delay block is coupled to the accumulator and is responsive to the address information outputted therefrom to select one of the plurality of delays to govern output of the desired signal.

4. The signal generator of claim 1, further comprising a divide-by-M element coupled between the output and (1) the first input of the mixer and (2) the input to the digital signal synthesizer, wherein the divide-by-M element divides the output signal by M before it is received by the mixer and digital signal synthesizer.

5. The signal generator of claim 4, wherein the divide-by-M element divides by 6.

6. The signal generator of claim 1, wherein the direct digital synthesizer is a quantized interpolated edge timed synthesizer.

7. The signal generator of claim 1, wherein the signal generator is a translation phase lock loop circuit.

8. A method of reducing phase noise content in a modulated signal, the method comprising:
   providing a phase modulated signal into a phase lock loop; and providing an output signal of the phase lock loop to a direct digital synthesizer within the feedback path of the phase lock loop:
receiving the output signal of the phase lock loop at an input of the direct digital synthesizer;
generating a synthesized signal to be received at an input of a switching mixer;
receiving the output signal of the phase lock loop at a local oscillator input of the switching mixer; and
generating a mixed output of the switching mixer at the phase detector input of the phase lock loop.

9. The method of claim 8, further comprising receiving course trim bits at the voltage control oscillator of the phase lock loop to program the voltage controlled oscillator at a selected output frequency range.

10. A phase lock loop comprising,
a first path responsive to a reference signal having a reference frequency and generating a desired output signal having an output frequency, the signal path having a reference signal input for receiving the reference signal and a feedback input, and generates the output signal based on a comparison of the reference signal at the reference signal input and a feedback signal at the feedback input; and
a feedback path responsive to the output signal and generating a feedback signal having a feedback frequency, the feedback path having a mixer coupled to the output signal and a carrier signal, and a digital signal synthesizer coupled to the output signal at an input and the mixer on an output, wherein the digital signal synthesizer synthesizes the output signal to generate the carrier signal.

11. The phase lock loop of claim 10, the first path further comprising a phase detector for comparing the reference signal to the feedback signal.

12. The phase lock loop of claim 10, the first path further comprising a voltage controlled oscillator coupled to the phase detector that generates the output signal.

13. The phase lock loop of claim 12, further comprising a loop filter coupled between the phase detector and the voltage controlled oscillator.

14. The phase lock loop of claim 10, wherein the direct digital synthesizer is a quantized interpolated edge timed synthesizer.

15. The phase lock loop of claim 10, wherein the phase lock loop is a translation phase lock loop circuit.

* * * * *